US009465304B2

(12) United States Patent
Haase et al.

(10) Patent No.: US 9,465,304 B2
(45) Date of Patent: Oct. 11, 2016

(54) ROLL-TO-ROLL DIGITAL PHOTOLITHOGRAPHY

(71) Applicant: 3M INNOVATIVE PROPERTIES COMPANY, St. Paul, MN (US)

(72) Inventors: Michael A. Haase, St. Paul, MN (US); Jeffrey H. Tokie, Scandian, MN (US); Daniel J. Theis, Mahtomedi, MN (US); Brian K. Nelson, Shoreview, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 653 days.

(21) Appl. No.: 13/929,505

(22) Filed: Jun. 27, 2013

(65) Prior Publication Data

US 2013/0286367 A1 Oct. 31, 2013

Related U.S. Application Data

(62) Division of application No. 13/141,108, filed as application No. PCT/US2009/068426 on Dec. 17, 2009, now Pat. No. 8,486,593.

(60) Provisional application No. 61/140,248, filed on Dec. 23, 2008.

(51) Int. Cl.
  *G03F 7/20* (2006.01)
  *G03F 7/22* (2006.01)
  (Continued)

(52) U.S. Cl.
  CPC ............. *G03F 7/70516* (2013.01); *G03F 7/22* (2013.01); *G03F 7/70791* (2013.01);
  (Continued)

(58) Field of Classification Search
  CPC .. G03B 27/50; G03B 27/465; G03B 27/587; G03G 15/30; G03F 7/24; G03F 7/707; G03F 7/703; G03F 7/22; G03F 7/70516; G03F 7/70791; G03F 9/7003; H05K 1/0269; H05K 1/0393; H05K 2201/09918; H05K 2203/1545; H05K 2203/163; H05K 2203/166; H05K 3/0008; H05K 3/0082
  See application file for complete search history.

(56) References Cited

U.S. PATENT DOCUMENTS 5,075,718 A * 12/1991 Suzuki .................. G03F 7/2002
  355/50
5,198,857 A    3/1993 Goto
  (Continued)

FOREIGN PATENT DOCUMENTS

JP   WO 2007029852 A1 *  3/2007 ........... G03F 7/7035
WO   WO 2006-036018      4/2006
  (Continued)

OTHER PUBLICATIONS

Blatt P., "Laser Direct Imaging Benefits From Solid State Technology", *Proceedings of the LANE* 2007, pp. 1221-1224.
  (Continued)

*Primary Examiner* — Steven H Whitesell Gordon
(74) *Attorney, Agent, or Firm* — Qiang Han

(57) ABSTRACT

A system for making flexible circuit films includes an inelastic conveyor, a web handling apparatus configured to pass a flexible substrate around the inelastic conveyor, an image acquisition apparatus configured to measure positions of a first set of alignment marks on the flexible substrate at a first conveyor location, an exposure apparatus configured to patternwise expose a photosensitive material on the flexible substrate at a second conveyor location, and an image processor configured to receive the measured positions of the first set of alignment marks, and to compare the measured positions with reference positions of the first set of alignment marks. The exposure apparatus is configured to patternwise expose the photosensitive material based on the comparison between the measured positions and the reference positions.

13 Claims, 6 Drawing Sheets

(51) Int. Cl.
*G03F 9/00* (2006.01)
*H05K 3/00* (2006.01)
*H05K 1/02* (2006.01)
*H05K 1/03* (2006.01)

(52) U.S. Cl.
CPC ......... *G03F 9/7003* (2013.01); *H05K 3/0008* (2013.01); *H05K 3/0082* (2013.01); *H05K 1/0269* (2013.01); *H05K 1/0393* (2013.01); *H05K 2201/09918* (2013.01); *H05K 2203/1545* (2013.01); *H05K 2203/163* (2013.01); *H05K 2203/166* (2013.01)

(56) References Cited

U.S. PATENT DOCUMENTS

| | | | |
|---|---|---|---|
| 5,691,541 | A | 11/1997 | Ceglio |
| 6,274,294 | B1* | 8/2001 | Hines .................. G03F 7/24 430/322 |
| 2005/0012919 | A1* | 1/2005 | Uemura ............ B41J 11/0085 355/72 |
| 2005/0213071 | A1 | 9/2005 | Fukuda |
| 2006/0132735 | A1* | 6/2006 | Lof ................... G03F 7/70291 355/53 |
| 2006/0141373 | A1 | 6/2006 | Casper Bijnen |
| 2007/0153397 | A1 | 7/2007 | Destain |
| 2008/0011225 | A1 | 1/2008 | McClure |
| 2008/0205010 | A1 | 8/2008 | Haase |
| 2009/0051891 | A1* | 2/2009 | Bijnen ............... G03F 7/70291 355/68 |
| 2010/0075158 | A1 | 3/2010 | Katayama |
| 2011/0188016 | A1* | 8/2011 | De Jager ........... G03F 7/70275 355/55 |

FOREIGN PATENT DOCUMENTS

| | | |
|---|---|---|
| WO | WO 2008-088650 | 7/2008 |
| WO | WO 2008-106305 | 9/2008 |

OTHER PUBLICATIONS

Kesler Matt, "New Technology for Accurate Positioning of Circuitry on Microvia Panels", 3722 Circuitree MK 002504, (date unknown but believed to be prior to the date of the filing of the present application), pp. 1-6.

Barclay Brewster, "Laser Direct Imaging: A User's Perspective", [available on the internet Oct. 1, 2001], [retrieved from the internet on Sep. 4, 2008], URL<http://www.circuitree.com/copyright/fd4a33c4318d7010VgnVCM100000f932a8c0_?view=print>, pp. 13.

"Laser Direct Imaging—The new Challenge for Liquid Resists", 3 pages, (date unknown but believed to be prior to the date of the filing of the present application).

Pflanz Tobias, "Conversion Efficiency Reduces Costs", *Laser + Photonics* (2008), pp. 46-47.

\* cited by examiner

ROLL-TO-ROLL DIGITAL PHOTOLITHOGRAPHY

CROSS REFERENCE TO RELATED APPLICATIONS

This application is a divisional of U.S. patent application Ser. No. 13/141,108 filed Jun. 21, 2011, now allowed, which is a national stage filing under 35 U.S.C. 371 of PCT/US2009/068426, filed on Dec. 17, 2009, which claims priority to U.S. Provisional Application No. 61/140,248, filed on Dec. 23, 2008, the disclosures of which are incorporated by reference in their entirety herein.

FIELD OF THE INVENTION

This invention relates generally to photolithography, with particular application to photolithography used to make multilayered circuits on flexible substrates. The invention also relates to related articles, systems, and methods.

BACKGROUND

Flexible circuits that feature multiple layers or levels of circuit traces formed on a flexible substrate are known. Reference is made, for example, to U.S. Patent Application Publication U.S. 2008/0205010 (Haase). The flexible circuit is formed by building up on the flexible substrate, layer-by-layer, a series of electrically conducting, semiconducting and insulating layers and patterning each of them as necessary using conventional photolithographic techniques to provide the desired multilayered circuit design. The photolithographic techniques generally include applying a layer of photoresist atop the layer or layers to be patterned, patterning the photoresist layer using an ultraviolet (UV) light source in combination with a photomask, and removing exposed portions of the underlying layer or layers (i.e., those portions that lack any photoresist thereon) with a suitable etchant. The photolithographic techniques also include lift-off techniques that generally include applying a layer of photoresist atop a substrate, patterning the photoresist layer using an ultraviolet (UV) light source in combination with a photomask, depositing a layer or layers of circuit materials on the substrate and the patterned photoresist, and removing the remaining photoresist, thereby removing the portion of the layer or layers deposited on the photoresist. For circuits that have multiple layers or levels, a set of different photomasks is used, and fiducial marks are provided on each of the photomasks so that each photomask can be aligned with the pattern formed by a previous photomask in an attempt to ensure proper registration of the respective layers that form the circuit.

Existing roll-to-roll photolithography systems typically use a UV light source and glass or polymer photomasks to generate patterns in the photoresist. In some cases, the systems use a frame-by-frame step-and-repeat type procedure. See e.g. U.S. Pat. No. 5,198,857 (Goto). In other cases, the systems may use a continuous process. See e.g. U.S. 2008/0011225 (McClure et al.).

BRIEF SUMMARY

We have now recognized that existing roll-to-roll photolithography systems are limited in their ability to produce flexible multilayered circuits with consistently small layer-to-layer alignment errors, as a result of physical distortions of the underlying polymer substrate or web during fabrication. This limitation has a direct effect on the minimum size of some features that can be used in the flexible multilayered circuit.

For example, during processing of thin-film integrated circuits on polymer substrates, a number of phenomena can cause distortions of the substrate. These may include:
- orientation and strain bias in the web as provided by the manufacturer;
- absorption and desorption of water or other solvents, particularly when made spatially non-uniform as a result of one or more patterned layers residing on the surface of the web;
- elastic and inelastic strain due to web tension; and
- heating and thermal expansion, particularly when made non-uniform or irreversible as a result of one or more of the patterned layers that define the circuit pattern.

When practicing traditional photolithography even on relatively small pieces of polymer substrate, these and other distortions can result in unavoidable alignment errors of over 20 μm on a circuit that is only 125 mm across. A typical registration design rule for a two-layer circuit fabricated roll-to-roll on a 12" (~300 mm) wide web with conventional photolithography is 100 μm. The layout for some simple thin-film integrated circuits can be designed in such a way as to function despite the misalignments caused by these distortions. See U.S. Patent Application Publication U.S. 2008/0205010 (Haase et al.), "Active Matrix Backplanes Allowing Relaxed Alignment Tolerance". However, those techniques may not be practical for more complex or higher performance circuits.

The presently disclosed techniques allow for dramatically enhanced functionality and performance in thin-film flexible circuits that are manufactured using roll-to-roll processes. Exemplary flexible circuit devices include high-resolution active matrix display backplanes with integrated row and column drivers, pixel drivers for active-matrix OLED displays, and highly functional radio frequency identification (RFID) products, for example.

Thus, we describe herein, among other things, a method of making a flexible circuit film. The method includes providing a flexible substrate, such as a web of polymer film, having a plurality of alignment marks and a photosensitive material thereon. The alignment marks may be, for example, features such as contact pads, endpoints or corners of circuit traces, vias, or the like from a previously deposited and patterned circuit layer, or they may be stand-alone fiducial marks that are provided for alignment purposes only and do not form part of any electrical circuit. The method also includes passing the substrate around an inelastic conveyor such that the substrate and the conveyor move together at least from a first conveyor location to a second conveyor location. The conveyor may be or comprise a steel roller or a steel belt, or any other suitable inelastic roller or belt, for example. The method includes measuring the positions of a first set of the alignment marks on a first portion of the substrate when the first portion of the substrate is at the first conveyor location, and patternwise exposing the photosensitive material on the first portion of the substrate when the first portion of the substrate has moved to the second conveyor location. The patternwise exposing is based on the measuring of the positions.

The method may also include providing reference positions for the first set of alignment marks, and comparing the measured positions to the reference positions to determine a distortion of the first portion of the substrate. The patternwise exposing may apply a distortion-corrected pattern to the photosensitive material on the first portion of the substrate.

We also disclose a roll-to-roll photolithography system that includes an inelastic conveyor and a web handling apparatus configured to pass a flexible substrate around the conveyor such that the substrate and the conveyor move together at least from a first conveyor location to a second conveyor location. The system may also include an image acquisition apparatus configured to measure positions of a first set of alignment marks on the substrate at the first conveyor location, and an exposure apparatus configured to patternwise expose a photosensitive material on the flexible substrate at the second conveyor location. The system may also include an image processor configured to receive the measured positions of the first set of alignment marks, and to compare the measured positions with reference positions of the first set of alignment marks. The image processor may, for example, calculate a distortion of the substrate based on the comparison of the measured positions with the reference positions. Preferably, the exposure apparatus is configured to patternwise expose the photosensitive material based on the comparison between the measured positions and the reference positions. For example, the exposure apparatus may be configured to patternwise expose the photosensitive material with a distortion-corrected pattern that is based on the calculated substrate distortion.

Related methods, systems, and articles are also discussed.

These and other aspects of the present application will be apparent from the detailed description below. In no event, however, should the above summaries be construed as limitations on the claimed subject matter, which subject matter is defined solely by the attached claims, as may be amended during prosecution.

BRIEF DESCRIPTION OF THE DRAWINGS

In the figures, like reference numerals designate like elements.

DETAILED DESCRIPTION OF ILLUSTRATIVE EMBODIMENTS

Figure 1:
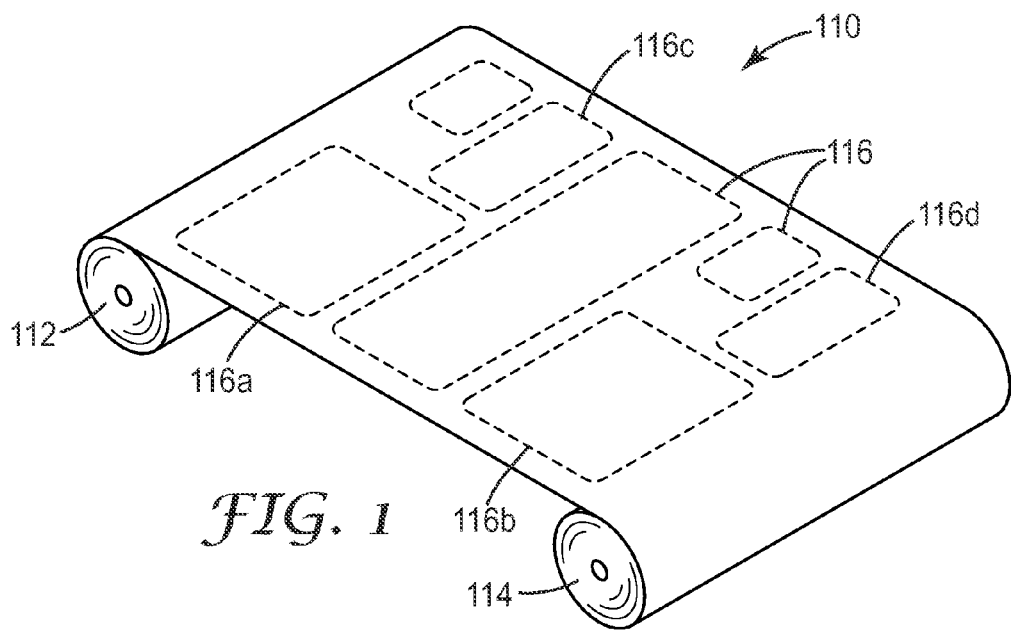
FIG. 1 is a perspective view of a roll of flexible multilayer circuit material that includes a flexible substrate.

In FIG. 1 we see in perspective schematic view a roll of flexible multilayered circuit film 110 partially unrolled and distributed between a first roll 112 and a second roll 114. The film 110 has a flexible substrate and a plurality of patterned circuit layers formed thereon. The circuit layers may form a single circuit design that extends from one end of the film 110, on roll 112, to the opposite end of the film 110, on roll 114. More typically, the circuit layers form a plurality of discrete multilayered circuits that are located in distinct areas or zones 116 of the film 110. In some cases, some or all of these discrete circuits can be later separated from each other by converting operations such as cutting the roll of film into corresponding discrete pieces or parts. The discrete circuits in zones 116 may all have nominally the same circuit layout, intended for the same end-use application, or only some may have the same circuit layout, or they may all have different circuit layouts. In the figure, zones 116a, 116b have the same size and shape and may contain nominally the same circuit design. Zones 116c, 116d likewise have the same size and shape (different from that of zones 116a, 116b) and may also contain nominally the same circuit design. Whether or not any two zones of the film 110 contain nominally the same circuit design, the film 110 typically includes areas that have physically distorted, to at least some extent, during the formation of the various multilayered circuits. This is most easily detectable by comparing two discrete circuits that are nominally the same but located on different portions of the roll; small differences between corresponding circuit features are typically attributable to film distortion. However, even where no two discrete circuits on the film 110 are nominally the same, it is still often possible to detect film distortion. For example, small deviations of circuit features from straightness, squareness, or roundness may be indicative of film distortion.

FIGS. 2a-d are top views of portions of flexible multi-layered circuit films, which demonstrate the phenomenon of substrate film distortion and also the way that techniques as disclosed herein are able to deal with and correct for such distortion.

Figure 2A:
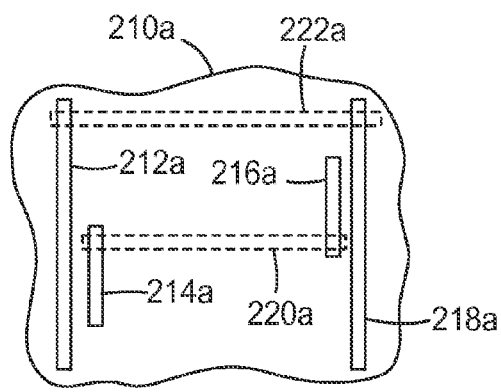
FIG. 2a is a top view of a portion of a flexible multilayer circuit, demonstrating the desired alignment between features of two circuit layers.

In FIG. 2a, a portion 210a of a flexible circuit film includes four circuit features 212a, 214a, 216a, 218a which may for example be conductive pathways, from a first circuit layer. The portion 210a also includes other circuit features 220a, 222a, which may be other conductive pathways, from a second circuit layer. The features 212a, 214a, 216a, 218a of the first circuit layer are formed in a first processing step or procedure of the flexible substrate, and the features 220a, 222a of the second circuit layer is formed in a second processing procedure at a different (later) time from features 212a, 214a, 216a, 218a. For example, if the flexible substrate is in the form of a roll, the entire roll may be processed from one end thereof to the other so as to form the first circuit layer in each of the discrete zones of the substrate. The substrate so processed may then be re-wound and processed again from end-to-end, this time so as to form the second circuit layer in each of the discrete zones. Of course, third, fourth, and additional circuit layers may also be formed in further process procedures. Note that each of the first and second processing procedures may include the separate steps of, for example, coating the substrate with a conductive material, coating the conductive material with a photosensitive material such as a positive or negative photoresist, patterning the photoresist by selective exposure to UV or other suitable light and developing the photoresist material so as to gain physical access to the coated material or substrate, depending on the nature of the photoresist, patterning the conductive material layer using an etching solution or other etching agent, and removing (stripping) the residual photoresist. One or both of the first and second processing procedures may also include the lift-off technique, in which case the circuit layer material is deposited on the substrate and on the patterned photoresist, and the layer is subsequently patterned by stripping the photoresist, thereby lifting-off the portion of the layer that was on the photoresist. (Note also that the descriptors "first" and "second" in this regard are for convenience only, and should not be construed to mean that no other processing procedures have been performed on the substrate prior to the "first" processing procedure, nor that other processing procedures have not been performed on the substrate between the first and second processing procedures.) By the time the portion 210a of the flexible film is ready for the formation of features 220a, 222a of the second circuit layer, the film may have become physically distorted in the vicinity of portion 210a relative to its physical layout at the time of the formation of features 212a, 214a, 216a, 218a.

In FIG. 2a, however, no such distortion has occurred. Rather, this figure is intended to show that, at a time when the second circuit layer is ready to be patterned in the photosensitive material, the circuit features 212a, 214a, 216a, 218a are in substantially the same orientations as when they were originally formed in a previous processing procedure. Circuit features 220a, 222a are formed in relation to features 212a, 214a, 216a, 218a in such a way that a terminus of feature 220a overlaps a terminus of feature 214a while avoiding feature 212a and that another terminus of feature 220a overlaps a terminus of feature 216a while avoiding feature 218a, as shown. Such overlap of feature 220a with features 214a and 216a may, for example, provide a conductive path from feature 214a to feature 216a. Similarly, circuit feature 222a is formed in relation to features 212a, 214a, 216a, 218a in such a way as to provide a conductive path between features 212a and 218a.

Figure 2B:
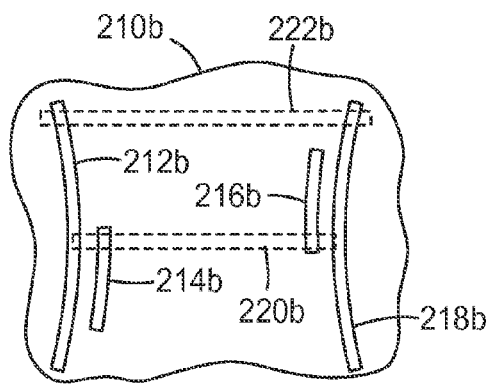
FIG. 2b is a top view of a portion of a flexible multilayer circuit similar to that of FIG. 2a, but where the substrate and one of the circuit layers has become distorted, and the feature of the other circuit layer is shown without any distortion correction.

In FIG. 2b, a portion 210b of the same flexible film is depicted, with portion 210b being similar to portion 210a, except that portion 210b has experienced a "pincushion" distortion after the formation of features 212a, 214a, 216a, 218a. The resulting distorted features 212b, 214b, 216b, 218b, were originally straight at the time of their formation, as shown by features 212a, 214a, 216a, 218a. However, due to any or all of the distortion-inducing phenomena mentioned above, they have become curved as shown in FIG. 2b, at a time when features 220b, 222b of the second circuit layer (corresponding to features 220a, 222a respectively of FIG. 2a) is ready to be formed. The features 220b, 222b are identical to respective features 220a, 222a, i.e., they include no adjustments or corrections to account for the distortions embodied in features 212b, 214b, 216b, 218b. Without such adjustments or corrections, feature 220b may improperly contact the distorted features 212b and 218b.

One approach of dealing with the problem depicted in FIG. 2b is to simply increase the minimum feature size (e.g. the conductive path line widths and spacing therebetween) until it is as large as or larger than the characteristic dimension associated with the distortion. Although this approach may avoid improper circuit connections, it is not considered desirable because of its associated larger feature size and lower circuit density.

Figure 2C:
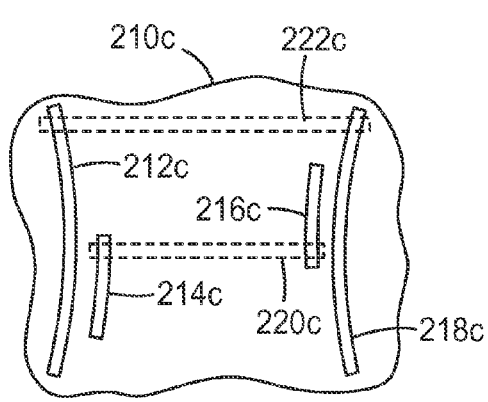
FIG. 2c is a top view of a portion of a flexible multilayer circuit similar to that of FIG. 2b, but where the feature of the other circuit layer is shown with distortion correction so as to be in alignment with the distorted first circuit layer.

Another approach of dealing with the problem of FIG. 2b, which we describe more fully below, is to identify and measure the distortion of features 212b, 214b, 216b, 218b, and then to adjust the geometry of the circuit feature of the second circuit layer (before actually forming such circuit feature) to account for those distortions. Thus, when the corrected or adjusted second circuit feature is formed atop the distorted features of the previously fabricated first circuit layer, it will again be in alignment with the appropriate portion of the (now distorted) first circuit layer. This latter approach is depicted in FIG. 2c. In that figure, circuit elements 212c, 214c, 216c, 218c are the same as circuit elements 212b, 214b, 216b, 218b, with the same pincushion distortion. In this case, however, the distortion has been measured, and used to define a distortion-adjusted circuit feature 220c. The distortion adjustment is a dimensional transformation relative to the original or "reference" circuit design (see e.g. FIG. 2a) that involves more than simply a global translation or rotation of the circuit design. In this case, feature 220c is reduced in length, while the geometry of feature 222c is not substantially changed from that of 222a. When the second circuit layer is formed in this fashion, terminuses of 220c again overlap the terminuses of circuit features 214c and 216c without contacting circuit features 212c or 218c, for proper circuit design. Note that the approach of FIG. 2c allows for the fabrication of rolls of flexible circuits whose minimum feature size, and/or whose layer-to-layer alignment error or registration error, may be less than the characteristic in-plane dimension associated with the distortion.

Figure 2D:
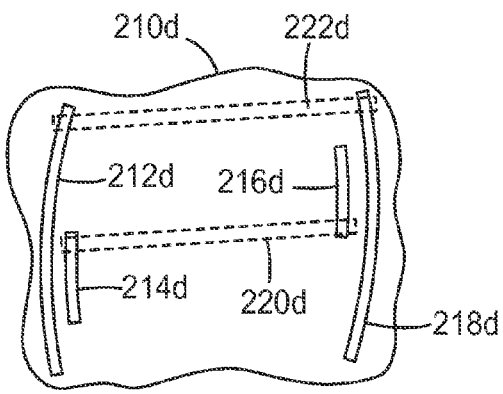
FIG. 2d is a top view of a portion of a flexible multilayer circuit similar to that of FIG. 2c, but where the first circuit layer and substrate are distorted in a different way.

FIG. 2d shows a portion 210d of the same flexible film as that of FIGS. 2a-c, but wherein portion 210d has undergone a "barrel" and a "shear" distortion rather than the pincushion distortion of FIGS. 2b and 2c. As in FIG. 2c, this distortion of the features 212d, 214d, 216d, 218d of the first circuit layer is again measured, and is used to define distortion-adjusted circuit features 220d and 222d. The second circuit layer, when formed using these distortion-adjusted features, properly connects distorted circuit features 214d and 216d using feature 220d, and properly connects distorted circuit features 212d and 218d using feature 222d. In this case, distortion-adjusted feature 220d is lengthened and tilted when compared to reference feature 220a, and distortion-adjusted feature 222d is only tilted when compared to reference feature 220a. As in FIG. 2c, the approach of FIG. 2d allows for the fabrication of flexible circuits whose layer-to-layer registration error may be less than the characteristic in-plane dimension associated with the distortion.

The reduced registration errors provided by the distortion-adjustment taught herein enable the design of smaller devices in the flexible circuits fabricated using these techniques and systems. In some embodiments, the flexible circuits include thin-film transistors. These distortion-adjustment techniques allow for reduced overlap between the source/drain electrodes and the gate, thereby reducing the associated parasitic capacitances and improving performance. Such thin-film transistors may include semiconductors such as (for example): ZnO; alloys of ZnO, such as GaInZnO; amorphous silicon; or organic semiconductors, such as pentacene. In some embodiments, the thin-film transistors may include anodized gate insulators formed by anodization of a gate electrode formed of an anodizable material, such as Al, W, Ti, Mo, and the like.

Figure 3A:
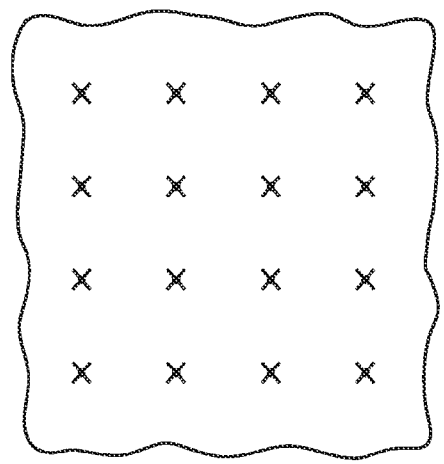
FIG. 3a is a top view of a portion of a flexible multilayer circuit showing a plurality of measured positions (each indicated with an "x") and reference positions (each indicated with a dot) of various alignment marks, in the case of no misalignment and no distortion of the flexible substrate.
Figure 3B:
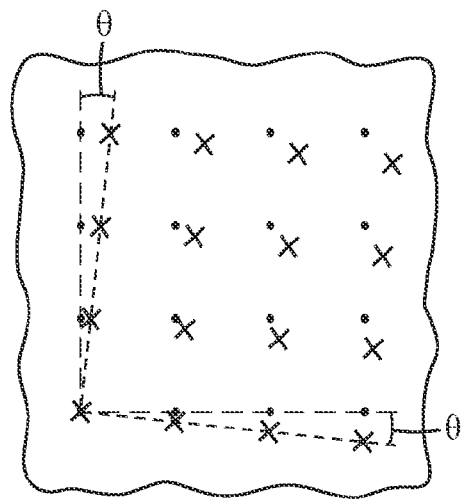
FIG. 3b is a top view of a portion of a flexible multilayer circuit similar to that of FIG. 3a, but in the case where the flexible substrate has a misalignment but no distortion.
Figure 3C:
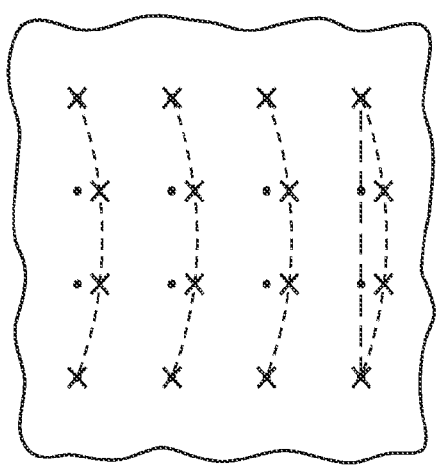
FIG. 3c is a top view of a portion of a flexible multilayer circuit similar to that of FIG. 3a, but in the case where the flexible substrate has distortion.

Turning now to FIGS. 3a-c, we see there top views of portions of a flexible multilayer circuit showing a plurality of measured positions (each indicated with an "x") and reference positions (each indicated with a dot) of various alignment marks. The alignment marks may be part of a first circuit layer that was processed in an earlier processing step so as to form the alignment marks in precise registration with the reference positions (dots), but sometime after that initial formation the flexible substrate may have become misaligned or distorted. For ease of description, the pattern of reference positions is shown as a regular grid with constant spacing in orthogonal in-plane directions, but this should not be considered as limiting. Any suitable pattern of alignment marks, whether regular or irregular, repeating or non-repeating, may be used to detect and measure substrate distortion.

In FIG. 3a, the measured positions ("x") are all in registration again with the respective reference positions (dots). Thus, the measured positions of the alignment marks are neither misaligned nor distorted relative to the reference positions. In FIG. 3b, the measured positions ("x") are misaligned with the reference positions (dots) by a simple rotation of angle $\theta$, as shown. This misalignment is not considered to be a "distortion" as that term is used here. In this regard, simple translations or rotations of the pertinent set of alignment marks, without more, is not considered to be "distortion". Global down-web and/or cross-web scaling factors, such as may be due to uniform film shrinkage or expansion in those in-plane directions, may be considered to be linear distortion, but is distinguished from nonlinear distortion as depicted e.g. in FIGS. 2b-d. In FIG. 3c, the measured positions deviate from the reference positions in a bow-shaped pattern. These deviations constitute neither a simple translation nor a simple rotation of the pattern of alignment marks. As such, the bow-shaped pattern of FIG. 3c constitutes a non-linear distortion that the flexible substrate may experience during processing, and that may be imparted to one of the circuit layers before formation of another circuit layer. This distortion can be quantified and characterized by systematically comparing the measured positions to the reference positions, and the distortion so characterized can then be used to adjust the shape of a subsequent circuit layer or layers to ensure proper layer-to-layer registration as shown in FIGS. 2c and 2d.

"Pincushion" deviations (FIGS. 2b, 2c), "barrel" deviations (FIG. 2d), and other curved deviations (FIG. 3c) are examples of a class of distortions that require more than 4 fiducials or alignment marks to detect, such distortions being referred to herein as nonlinear distortions. Nonlinear distortions include those that cannot be accurately described in terms of simple linear stretching or shrinking. Preferably, the disclosed photolithography systems are capable of detecting and correcting for various classes of distortions, including nonlinear distortions.

Figure 4A:
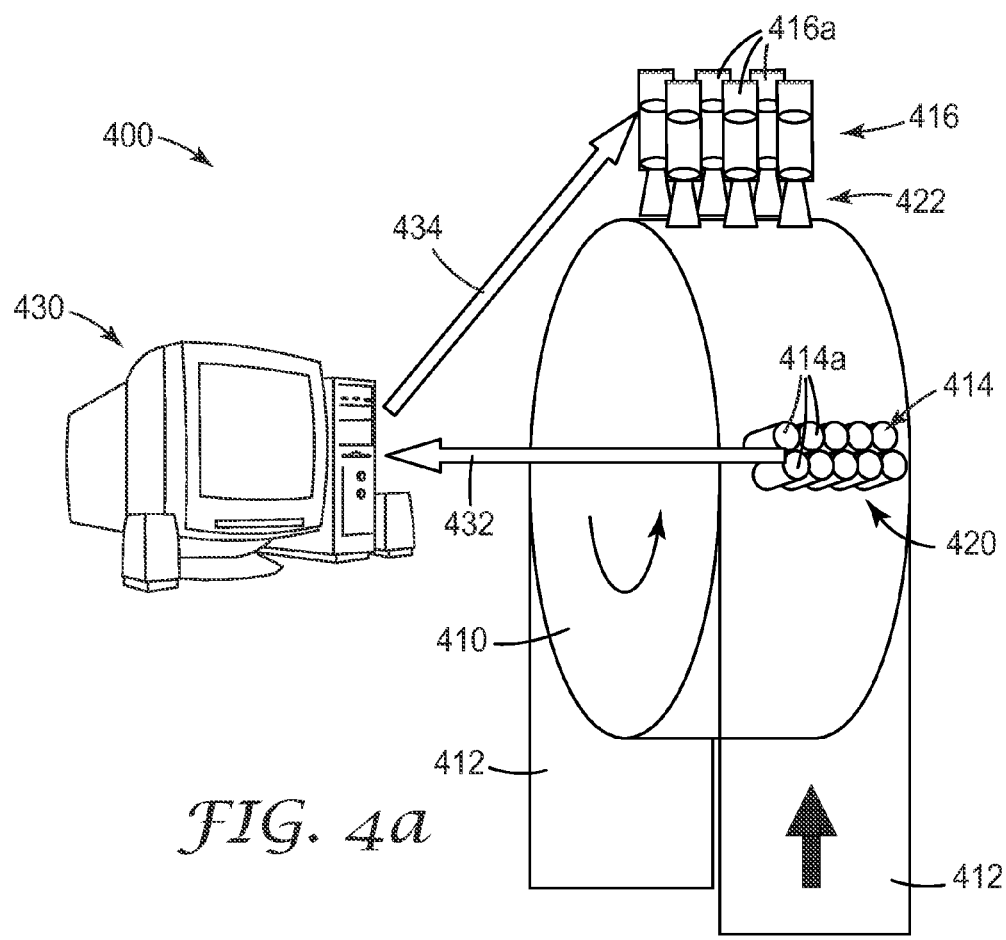
FIG. 4a is a schematic perspective view of a portion of a roll-to-roll photolithography system.

FIG. 4a shows a perspective view of a portion of a roll-to-roll photolithography system 400 capable of implementing the distortion correction discussed above, and FIG. 4b is a schematic side view of such system. In this system, a single roller 410, preferably composed of a substantially inelastic material such as stainless steel and having a relatively large radius, serves as an inelastic conveyor for a flexible substrate or web 412 on which the multilayered circuit is being formed. An "inelastic" conveyor in this context refers to a conveyor that under normal operating conditions does not appreciably stretch or otherwise distort on a scale that would interfere with proper formation of the desired microscopic circuit features as discussed herein. The substrate 412 passes around the roller 410 and the roller 410 rotates such that the substrate 412 and the roller 410 move together from a first point of contact between the substrate 412 and the roller 410 at point 409 to a last point of contact between the substrate and the roller at point 411, as shown. In the figure, the first and last points of contact encompass about half of the circumference of the roller, but a larger or smaller portion of the circumference may be used.

Figure 4B:
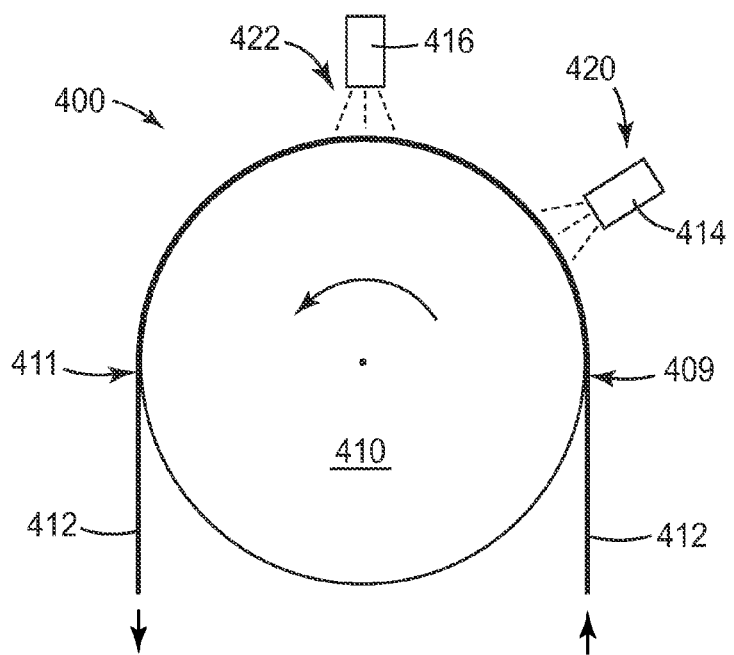
FIG. 4b is a schematic side view of such system, in which a single roller serves as an inelastic conveyor.

The system also includes an image acquisition apparatus 414, shown schematically in FIG. 4b but shown with a plurality of individual camera devices 414a in FIG. 4a, and an exposure apparatus 416 which is also shown schematically in FIG. 4b but is shown in more detail with a plurality of individual exposure devices 416a in FIG. 4a. The image acquisition apparatus 414 is disposed at a first conveyor location 420, which location 420 may be a fixed point or region in space. The exposure apparatus 416 is disposed at a second conveyor location 422, which location 422 may be another fixed point or region in space. Note that the locations 420, 422 are disposed between (from the perspective of the substrate or web) the first and last points of contact 409, 411, and thus the substrate 412 and roller 410 also move together from the first conveyor location 420 to the second conveyor location 422. The locations 420 and 422 are preferably far enough from the first and last contact points such that the substrate cannot slip with respect to the conveyor at location 420 or 422. A computer system 430 communicates with both the image acquisition apparatus 414 and the exposure apparatus 416, including at least receiving digital image information as indicated by arrow 432 and transmitting exposure information as indicated by arrow 434.

Although not shown in FIG. 4a or 4b, the system 400 also preferably includes: an unwind station for continuously unwinding the substrate 412; a wind-up station for continuously winding up the processed substrate; and web handling and web steering apparatuses as needed to maintain good web control and positioning throughout the system. Ancillary systems for further processing the patternwise exposed web may include: one or more deposition stations for depositing circuit materials such as conductors, semiconductors, and insulators on the substrate; a station for applying one or more photosensitive materials such as positive or negative photoresist(s) to the substrate; a photoresist removal station for removing exposed or unexposed portions of the photoresist, as appropriate; and an etching station for removing exposed portions of circuit material layer(s) that have a patterned photosensitive material disposed thereon.

In brief overview, the roll-to-roll photolithography system 400 uses digital image acquisition and digital exposure of photo-sensitive material, such as photoresist, to enable photolithography in a roll-to-roll system with precise alignment to a pre-existing pattern on the web. The system can acquire digital images of the pre-existing patterns on the web (e.g., patterned layers previously formed on the web by photolithography) and can digitally adjust the pattern to be exposed, e.g. using the computer system 430, to compensate for any distortions that were detected in the pre-existing pattern. Digital representations of the distortion-adjusted pattern can be calculated by the computer system 430 and communicated to the exposure apparatus 416 with little delay so that when the portion of the web with the measured distortion(s) passes by the second conveyor location 422, an appropriately modified (distortion adjusted) pattern is exposed. That is, the exposed pattern is made to incorporate distortions that were measured at the first conveyor location 420 so that the distortion-adjusted pattern precisely aligns with the pre-existing (and distorted) pattern, permitting the fabrication of, for example, thin-film integrated circuits with much smaller layer-to-layer registration errors, thereby allowing smaller device designs and higher performance than would otherwise be possible in a roll-to-roll system.

In some embodiments, the roll-to-roll photolithography system 400 can also include autofocus systems (not shown) to correct for variations in the thickness of the substrate 412 or changes in the height of the conveyor (for example, the deviation of a roller from circular). The autofocus systems determine the height of the substrate surface at one or more points across the web at or near the first conveyor location, and the photolithography system can then use that height information to adjust the focus of the image acquisition apparatus and/or the exposure apparatus.

In other embodiments, the roll-to-roll photolithography system 400 can also have optical systems that have sufficient depth of focus to account for a wide range of substrate thicknesses and deviation in the roundness of the conveyor.

A pattern alignment system can use any number of features, referred to here as alignment marks, in the pre-existing pattern to determine how to distort the pattern to be exposed. The locations of these features are determined by a digital imaging system that processes the image information generated by image acquisition apparatus 414. The required distortion of the pattern to be exposed can then be calculated from the measured displacement of the pre-existing features from their expected or reference locations. Refer, for example, to FIGS. 2a-d and 3a-c and the associated discussion. Linear, piecewise linear, or nonlinear (e.g. two dimensional cubic spline) interpolation can be used to calculate the distortion in regions around these features.

Significantly, both the digital image acquisition and the digital exposure are preferably performed while the web is in contact with, but at different locations on, the same inelastic conveyor such as a suitable roller or belt, thereby substantially avoiding any error due to stretching of the web between the image acquisition and exposure steps. Stated differently, the web is preferably in contact with the same inelastic conveyor at the first and second conveyor locations 420, 422, and preferably also in continuous contact with such conveyor at least between those locations, so that any distortions observed in any given portion of the web at location 420—which distortions form the basis of the distortion-adjusted pattern to be exposed later on that same portion of the web—are substantially unchanged as that portion of the web travels to location 422 where the distortion-adjusted pattern is then exposed. In this regard, the web speed is preferably matched with the speed of the inelastic conveyor (such as the outer surface of roller 410) such that slippage between the web and the conveyor is avoided.

The photolithography system 400 preferably operates in a continuous mode, meaning the web is in continuous motion during the image acquisition and digital exposure procedures, although other modes of operation are also possible. Furthermore, the web also preferably moves at a constant speed during these procedures. Operating in a continuous mode offers advantages of simplifying the control of the web motion and the potential for higher throughput. To help accomplish this, the exposure apparatus 416 may be designed to include a scrolling capability such that the features to be exposed generally at location 422 scroll in the down-web direction (e.g. from an up-web boundary or edge of an exposure area disposed generally at location 422 to an opposite down-web boundary or edge of the exposure area) at the same speed as the web so as to track the movement of the web. Furthermore, pulsing of the laser or other light source used in the exposure apparatus 416 can also help minimize any blurring due to the web movement.

The system 410 can also include mechanisms to handle and pre-align the web. In some embodiments, the pattern formed by the first level process leaves alignment marks to which subsequent levels can be aligned. In some embodiments, alignment marks are formed by techniques such as, for example, printing, embossing, or laser engraving. In addition, other marks specifically for the steering of the web may be formed on the web. These may, for example, take the form of lines, sinusoidal lines or other marks near an edge of the web. Reference is made to PCT Patent Publication WO 2008/088650 (Carlson et al.), "Web Longitudinal Position Sensor", incorporated herein by reference. In addition, features may be formed on the web, such as bar codes or other marks to indicate absolute position along the web and/or serial numbers. These marks can optionally be read by the image acquisition apparatus 414 or other imaging systems. Some details of the image acquisition apparatus 414 and the exposure apparatus 416 will be discussed further below, but first we turn our attention to an alternative roll-to-roll photolithography system 500 shown in FIG. 5.

Figure 5:
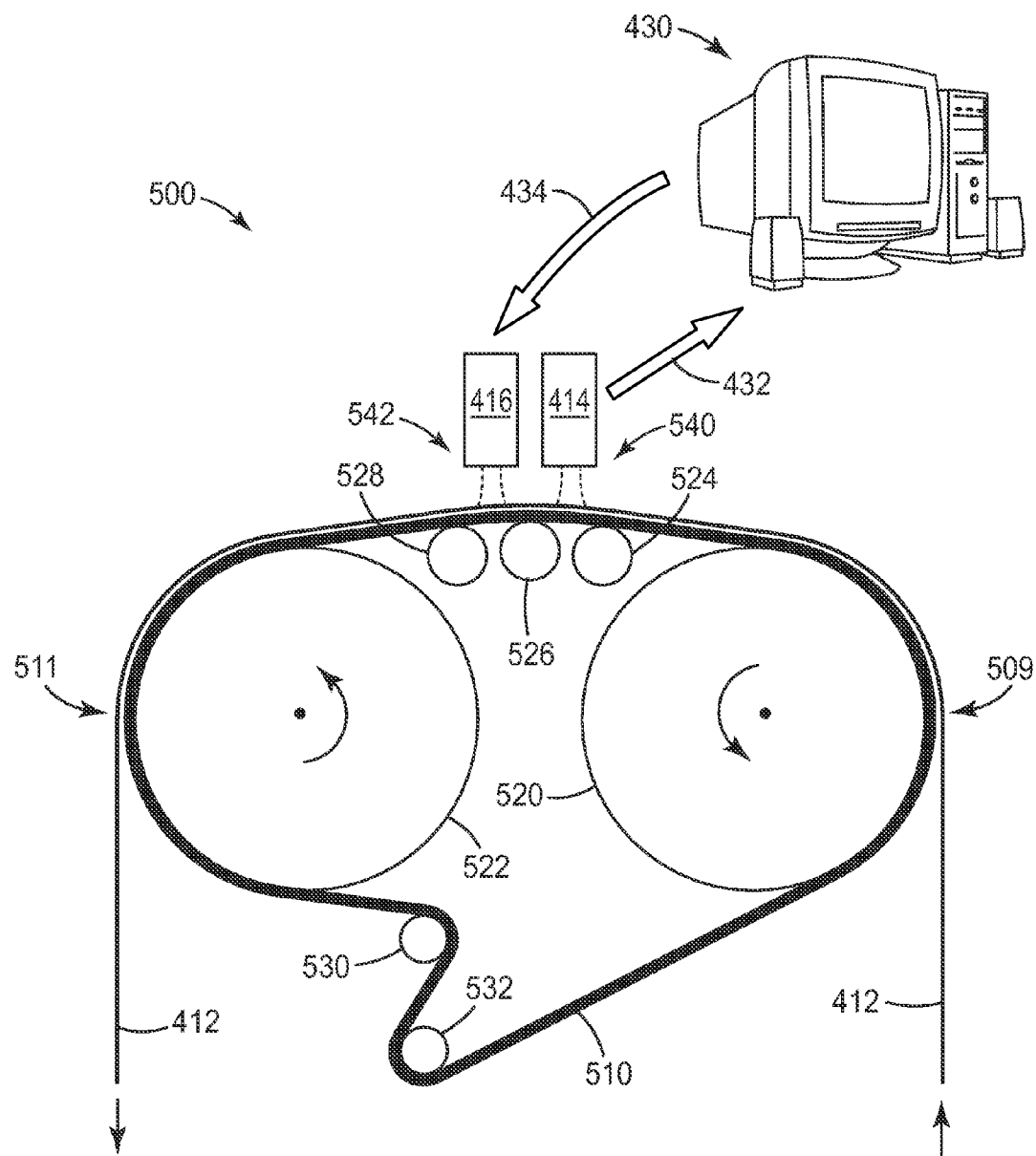
FIG. 5 is a schematic side view of a portion of an alternative roll-to-roll photolithography system, in which an inelastic belt serves as an inelastic conveyor.

The system 500 of FIG. 5 can function in most or all significant respects like system 400 of FIG. 4, and for that reason certain components or elements of FIG. 5 have the same reference numerals as in FIG. 4 to indicate they are the same or similar to the corresponding components of FIG. 4, which have already been discussed above and will not be repeated here. As with system 400, roll-to-roll photolithography system 500 is capable of implementing the non-liner distortion correction discussed above. However, instead of using a single roller as the inelastic conveyor of the substrate or web 412, system 500 uses an inelastic belt 510, such as a steel belt or the like, wound around a plurality of drums or rollers 520, 522, 524, 526, 528, 530, and 532 as shown. The optional backup rollers 524, 526, 528 may be disposed such that they each make definite contact with the belt; they may be elevated somewhat relative to rollers 520, 522 in order to provide adequate tension and some degree of curvature to the belt 510, which in turn can help to maintain a taught frictional connection between the substrate 412 and the belt 510. Belt 510 is similar to roller 410 insofar as both of these conveyors are capable of continuous cyclic motion for compatibility with a continuously moving web. The substrate 412 passes around the belt 510 and the belt 510 "rotates" (advances along its closed-loop path) such that the substrate 412 and the belt 510 move together from a first point of contact 509 between the substrate 412 and the belt 510 to a last point of contact 511 between the substrate and the belt, as shown. The first and last points of contact may encompass a large portion or a small portion of the length of the belt, as desired.

Both the digital image acquisition (see image acquisition apparatus 414) and the digital exposure (see exposure apparatus 416) are preferably performed while the web is in contact with, but at different locations on, the belt 510, thereby substantially avoiding any error due to stretching of the web between the image acquisition and exposure steps. Stated differently, the web is preferably in contact with the inelastic belt 510 at the locations where the image acquisition and the digital exposure are performed, and is preferably also in continuous contact with the belt at least between those locations, so that any distortions observed in any given portion of the web at the location of image acquisition—which distortions form the basis of the distortion-adjusted pattern to be exposed later on that same portion of the web—are substantially unchanged as that portion of the web travels to the location where the distortion-adjusted pattern is then exposed. In this regard, the web speed is preferably matched with the advancement speed of the belt 510 such that slippage between the web and the belt is avoided.

In system 500, the image acquisition apparatus 414 is disposed at a first conveyor location 540, which location 540 may be a fixed point or region in space. The exposure apparatus 416 is disposed at a second conveyor location 542, which location 542 may be another fixed point or region in space. The locations 540, 542 are disposed between (from the perspective of the substrate or web) the first and last points of contact 509, 511, and thus the substrate 412 and belt 510 also move together from the first conveyor location 540 to the second conveyor location 542.

We return now to a discussion of considerations relating to the image acquisition apparatus 414 and the exposure apparatus 416.

The image acquisition system may comprise only one high-resolution camera device, or it may comprise an array of high resolution camera devices 414a as depicted in FIG. 4a. In either case it preferably generates a high resolution digital image of the web and the alignment marks thereon at high speed over a defined imaging area that has a specific width (cross-web dimension) and length (down-web dimension). In some cases the width of the imaging area may be approximately equal to the width of web 412, and the length of the imaging area may be a function of the curvature of the web at the imaging location in combination with the depth-of-focus of the image acquisition system, as discussed further below. If an array of separate camera devices 414a is used, the cameras may be arranged in staggered rows as shown in FIG. 4a so that individual imaging sub-areas associated with each camera device 414a can be arranged in an overlapping patchwork-like arrangement to form the larger imaging area. The imaging subareas may also be rotated slightly so that rows of pixels within the subareas are slightly inclined relative to the down-web direction to improve the effective resolution of the cameras when acquiring multiple sequential images of an alignment mark.

The image acquisition system also preferably includes one or more light sources to ensure proper illumination levels for the camera device(s). However, while providing adequate light levels for the image acquisition system, such illumination from such light source(s) should not effectively expose or otherwise interfere with the photosensitive material on the flexible substrate. Yellow or red light, for example, may be used so as to provide illumination for the camera devices while avoiding undesirable exposure of the photoresist. The illuminating light source(s) may also be strobed or otherwise pulsed, which may be particularly beneficial at high web speeds to avoid image blurring and to ensure clear imaging of the alignment marks on the web.

The exposure apparatus may, analogously to the image acquisition system, include only one exposure device, or it may include an array of individual exposure devices 416a as depicted in FIG. 4a. In either case the exposure apparatus preferably provides high resolution exposure of the photosensitive material over a defined exposure area that has a specific width (cross-web dimension) and length (down-web dimension). The width of the exposure area may be about equal to the width of web 412, and the length may be a function of the curvature of the web at the exposing location in combination with the depth-of-field of the exposure apparatus, as discussed further below. If an array of separate exposure devices 416a is used, the exposure devices may be arranged in staggered rows as shown in FIG. 4a so that individual exposure sub-areas associated with each exposure device 416a can be arranged in an overlapping patchwork-like arrangement to form the larger exposure area. The exposure subareas may also be rotated slightly so that rows of pixels within the subareas are slightly inclined relative to the down-web direction to improve the effective exposure resolution.

The exposure apparatus of course includes one or more light sources with which to expose the photosensitive material. Typically, such light sources emit relatively short wavelength light, such as near ultraviolet light, but any wavelength that is suitable for exposing the particular photosensitive material or materials being used on the web may be used.

The exposure apparatus is preferably electronically addressable so that the high resolution pattern to be exposed can be rapidly projected onto the photosensitive material on the web in response to distortion-adjusted pattern signals generated by the computer system 430 or a similar device. The exposure apparatus may incorporate a variety of known electronically addressable mechanisms for patternwise exposing the photoresist material. One type of mechanism uses a small focused beam of exposing radiation, and rapidly scans the beam along orthogonal directions in the exposure area while electronically modulating the beam as appropriate to trace out the desired pattern. Another type of mechanism uses a large area beam of exposing radiation that is spatially modulated with a digital micro-mirror device (DMD) or other electronically addressable spatial light modulator device.

Figure 6:
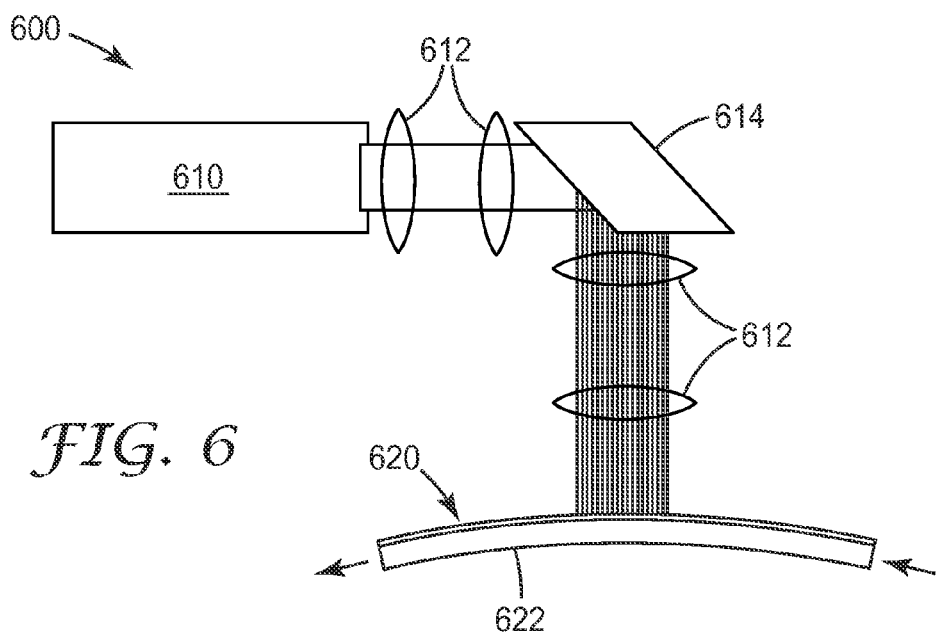
FIG. 6 is a schematic side view of an exposure apparatus suitable for use with the systems of FIGS. 4a-b or 5.
Figure 7:
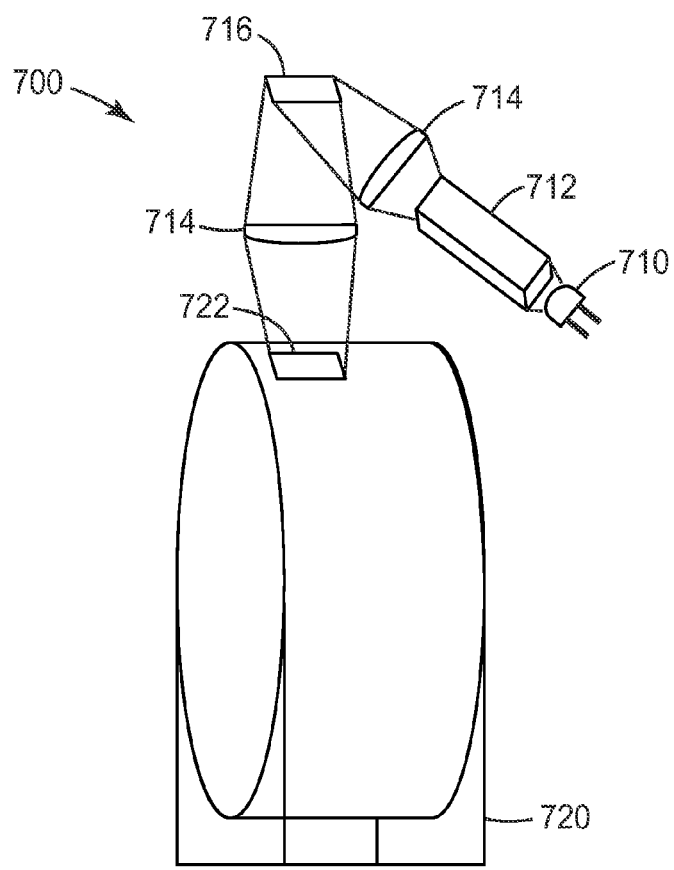
FIG. 7 is a schematic perspective view of an alternative exposure apparatus suitable for use with the systems of FIGS. 4a-b or 5.

FIGS. 6 and 7 schematically depict exposure apparatuses that utilize a DMD and that may be suitable for use in the disclosed photolithographic systems. In FIG. 6, exposure apparatus 600 includes one or more laser sources, such as UV laser diodes 610, suitable beam-shaping optics 612, and DMD 614. The DMD 614 selectively reflects light from the laser diodes in a high resolution digital format onto the photosensitive coating 620 atop the moving flexible substrate 622. The apparatus 600 may be of similar design to that of Laser Direct Imagers (LDI) currently in use to make rigid printed circuit boards. In FIG. 7, exposure apparatus 700 includes a non-laser source such as a UV LED 710 or even a mercury arc lamp (not shown). Light from such a source is homogenized using a short waveguide referred to as an integrating tunnel 712, and beam-shaping optics 714 convey the homogenized beam to a DMD 716 and from there onto the photosensitive material atop the flexible substrate 720 in an exposure sub-area 722. In some cases, the integrating tunnel 712 may be eliminated and replaced with a beam homogenizer design as described in U.S. Patent Application Publication U.S. 2007/0153397 (Destain), "Projection System with Beam Homogenizer", for example.

In still other alternative designs, the exposure apparatus may comprise one or more 1- or 2-dimensional arrays of independently addressable UV LEDs. A suitable optical system may image the LED array(s) onto the photosensitive material disposed on the web to accomplish the pattern-wise exposure.

As mentioned above, the length (down-web dimension) of the imaging area may be a function of the depth-of-focus of the image acquisition system in combination with the curvature of the web at the imaging location, and the length of the exposure area may similarly be a function of the depth-of-field of the exposure apparatus in combination with the curvature of the web at the exposing location. In particular, if the length of the relevant area (whether the imaging area of the exposure area) is expressed as "L", and if the depth-of-focus or depth-of-field, as the case may be, is expressed as "h", then the minimum radius of curvature of the web at the pertinent location (the imaging location or the exposure location, as appropriate) can be expressed as "r" and is related to "h" and "L" by the following equation:

$$r = L^2/8h$$

This relationship can be used to calculate a minimum roller radius for systems such as that of FIG. 4, or a minimum belt radius of curvature (at the imaging location or the exposure location, as appropriate) for systems such as that of FIG. 5, for a given depth-of-focus of the image acquisition apparatus or for a given depth-of-field of the exposure apparatus.

In some cases, the flexible substrate or web is intentionally designed to be optically transparent or to be at least partially light transmissive. In those cases, the optical characteristics of the inelastic conveyor may become important for optimal performance of the image acquisition system and/or the exposure apparatus. In particular, it may be desirable to treat the outer surface of the inelastic conveyor to tailor the surface reflectivity. In the case of the exposure apparatus, which typically utilizes UV light, oblique-angle surface reflections from the inelastic conveyor, transmitted through the light transmissive substrate, may undesirably expose portions of the photosensitive material that were not intended to be exposed. Thus, it may be desirable to ensure that the inelastic conveyor has a low surface reflectivity at UV wavelengths. In the case of the image acquisition system, which typically utilizes yellow or red light, strong surface reflections from the inelastic conveyor, transmitted through the light transmissive substrate, may compete with reflections from the alignment marks so as to provide poor image contrast of the alignment marks. However, depending upon whether bright-field or dark-field illumination is used, in other cases the alignment marks may have low reflectivity (dark), in which case it may be desirable for the inelastic conveyor to provide a highly reflective/scattering background for optimal contrast. In embodiments where a roller is used as the inelastic conveyor, one approach for tailoring the surface reflective properties is to provide a suitably colored roller cover, such as are sold by Fluoron Inc., Elkton, Md. In other cases the polished metal surface of the roller or belt may be acceptable, or such surface may be anodized or otherwise treated to change its reflectance. Whichever approach is used, the tailored surface preferably retains good mechanical characteristics such as smoothness and friction, and preferably remains stable without substantial degradation at elevated temperatures and under the other applicable process conditions.

Figure 8:
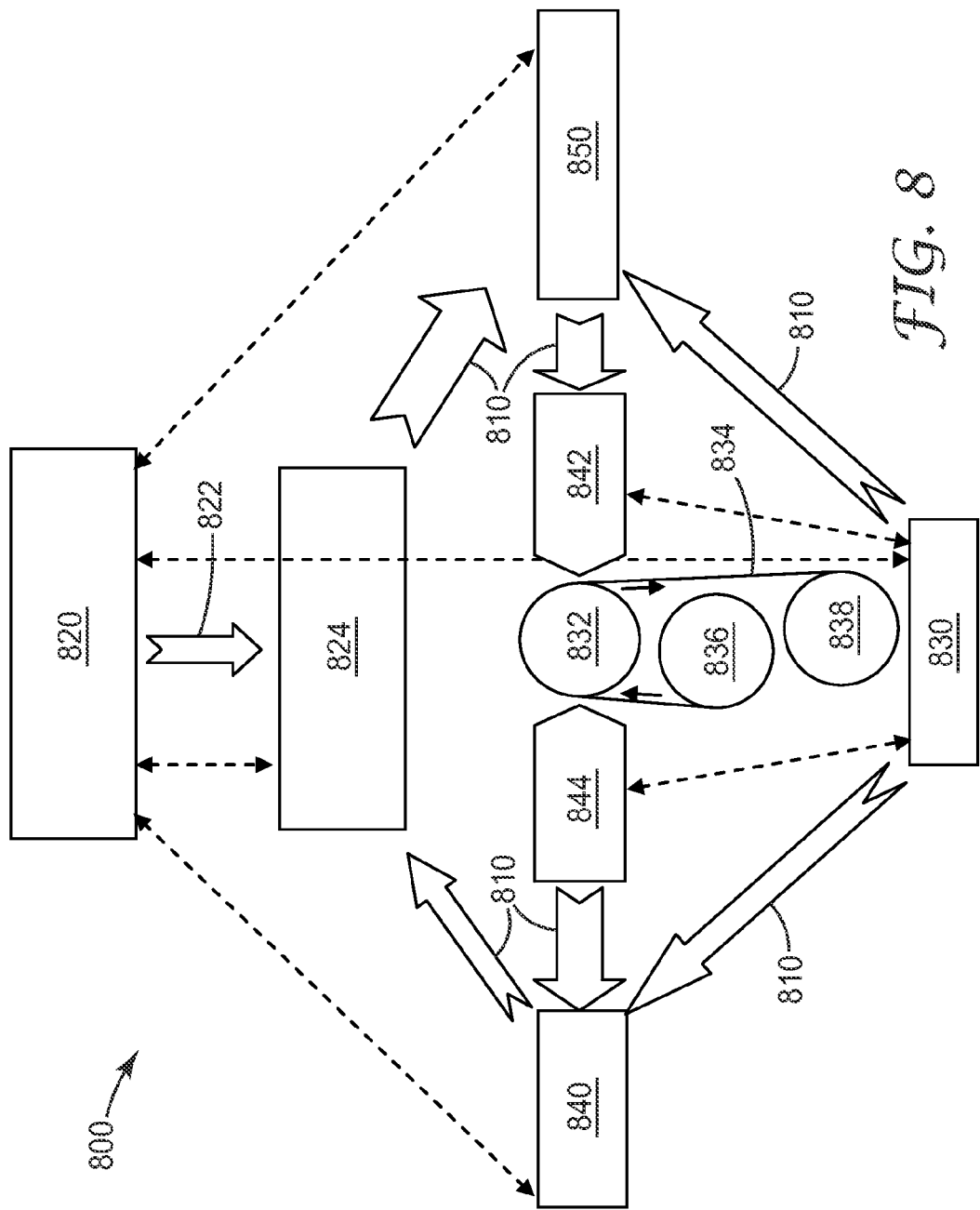
FIG. 8 is a schematic view of a roll-to-roll photolithography system and functional components thereof.

FIG. 8 depicts a block diagram of a roll-to-roll digital photolithography system 800, showing selected components, systems, and subsystems according to one possible organizational scheme. Arrows 810 indicate the flow of data. Dashed lines indicate control and status signals. The system 800 includes a digital photolithography system controller 820, which provides high-level system control and synchronization of the other subsystems, including start, stop, and speed commands, and provides raw image data 822 (including the circuit layout) to an image processor 824. A web handling subsystem 830 includes a main inelastic roller 832, or belt, upon which the flexible web 834 is wrapped during image acquisition of alignment marks, and patternwise exposure. Also shown are additional rollers 836, 838, which can be used for winding the web, unwinding the web, or both at different stages of the process. The diameter of main roller 832 is sufficiently large that the web stays within the depth of focus of the exposure engines and the digital cameras over their respective working areas or fields of view. The main roller 832 or belt preferably includes a drive motor (not shown) and high-precision position encoder (not shown). Data from the encoder is used by image analyzers 840 to determine the precise position of the alignment marks. The encoder data can also be used to synchronize exposure engines 842 with the web position.

The web handling subsystem 830 is responsible for positioning the web 834 such that the alignment marks disposed thereon are within the field of view of digital cameras 844, and for triggering the strobe lights (not shown) and cameras. The digital cameras 844 provide images of the web which are provided to the image analyzers 840, which in turn identify and locate alignment marks that have been previously formed on the web. The image processor 824 is responsible for taking the raw image data 822—i.e., the undistorted layout or "reference pattern" of the circuit layer to be patterned—in the form of a monochrome bitmap and distorting and positioning it to align with the previously formed layers based on the locations of the alignment marks as reported by the image analyzers 840. Exposure engine controllers 850 are also provided to receive the distortion-adjusted image data from the image processor 824, and control the digital exposure engines 842 to project the appropriate distortion-adjusted images onto the web.

In some embodiments, the image analyzers, image processors, or other computer subsystems may include multiple microprocessors and provisions for parallel-processing. For example, a different microprocessor or group of microprocessors may be dedicated to analyzing the images from each of the digital cameras 844. In another example, a different microprocessor or group of microprocessors may be dedicated to generating that portion of the distorted and aligned image provided to each of the exposure engine controllers 850.

Unless otherwise indicated, all numbers expressing quantities, measurement of properties and so forth used in the specification and claims are to be understood as being modified by the term "about". Accordingly, unless indicated to the contrary, the numerical parameters set forth in the specification and claims are approximations that can vary depending on the desired properties sought to be obtained by those skilled in the art utilizing the teachings of the present application. Not as an attempt to limit the application of the doctrine of equivalents to the scope of the claims, each numerical parameter should at least be construed in light of the number of reported significant digits and by applying ordinary rounding techniques. Notwithstanding that the numerical ranges and parameters setting forth the broad scope of the invention are approximations, to the extent any numerical values are set forth in specific examples described herein, they are reported as precisely as reasonably possible. Any numerical value, however, may well contain errors associated with testing or measurement limitations.

Various modifications and alterations of this invention will be apparent to those skilled in the art without departing from the scope and spirit of this invention, and it should be understood that this invention is not limited to the illustrative embodiments set forth herein. All U.S. patents, patent application publications, and other patent and non-patent documents referred to herein are incorporated by reference, to the extent they are not inconsistent with the foregoing disclosure.

The invention claimed is:

1. A roll-to-roll photolithography system, comprising:
   an inelastic conveyor, wherein the inelastic conveyor consists of a single roller;
   a web handling apparatus configured to pass a flexible substrate around the conveyor such that the substrate and the conveyor move together at least from a first conveyor location to a second conveyor location;
   an image acquisition apparatus configured to measure positions of a first set of alignment marks on the substrate at the first conveyor location;
   an exposure apparatus configured to patternwise expose a photosensitive material on the flexible substrate at the second conveyor location; and
   an image processor configured to receive the measured positions of the first set of alignment marks, and to compare the measured positions with reference positions of the first set of alignment marks;
   wherein the exposure apparatus is configured to patternwise expose the photosensitive material based on the comparison between the measured positions and the reference positions; and
   wherein the image acquisition apparatus comprises an array of high resolution camera devices to generate a high resolution digital image of the first set of the alignment marks.

2. The system of claim 1, wherein the image acquisition apparatus is configured to measure the positions of the first set of alignment marks while the substrate is in motion.

3. The system of claim 2, wherein the image acquisition apparatus comprises a strobed light source.

4. The system of claim 1, wherein the exposure apparatus is configured to patternwise expose the photosensitive material while the substrate is in motion.

5. The system of claim 1, wherein the image processor is further configured to calculate a distortion of the substrate based on the comparison, and wherein the exposure apparatus is configured to patternwise expose the photosensitive material based on the calculated distortion.

6. The system of claim 1, wherein the system is configured to synchronize operation of the image acquisition apparatus with operation of the exposure apparatus such that the exposure apparatus exposes a portion of the substrate that was measured by the image acquisition apparatus.

7. The system of claim 1, wherein the image acquisition apparatus has an imaging area of length "L" at the first conveyor location, and a depth of focus "h"; and
   wherein the single roller has a minimum radius of curvature "r" according to the expression:
   $$r = L^2/8h.$$

8. The system of claim 1, wherein the exposure apparatus has an exposure area of length "L" at the second conveyor location, and a depth of field "h"; and
   wherein the single roller has a minimum radius of curvature "r" according to the expression:
   $$r = L^2/8h.$$

9. The system of claim 1, wherein the first and the second conveyor locations are far enough from first and last points of contact between the flexible substrate and the inelastic conveyor such that the flexible substrate cannot slip with respect to the inelastic conveyor.

10. The system of claim 1, wherein the first set of alignment marks comprises more than 4 alignment marks.

11. A roll-to-roll photolithography system, comprising:
    an inelastic conveyor;
    a web handling apparatus configured to pass a flexible substrate around the conveyor such that the substrate and the conveyor move together at least from a first conveyor location to a second conveyor location;
    an image acquisition apparatus configured to measure positions of a first set of alignment marks on the substrate at the first conveyor location, wherein the first set of alignment marks comprises more than 4 alignment marks;
    an exposure apparatus configured to patternwise expose a photosensitive material on the flexible substrate at the second conveyor location; and
    an image processor configured to receive the measured positions of the first set of alignment marks, and to compare the measured positions with reference positions of the first set of alignment marks;
    wherein the exposure apparatus is configured to patternwise expose the photosensitive material based on the comparison between the measured positions and the reference positions;
    wherein the image processor is further configured to calculate a nonlinear distortion of the first portion of the flexible substrate;
    wherein the exposure apparatus is further configured to patternwise expose the photosensitive material based on the calculated nonlinear distortion; and
    wherein the image acquisition apparatus comprises an array of high resolution camera devices to generate a high resolution digital image of the first set of the alignment marks.

12. The system of claim 11, wherein the image acquisition apparatus is configured to measure the positions of the first set of alignment marks while the substrate is in motion.

13. The system of claim 11, wherein the exposure apparatus is configured to patternwise expose the photosensitive material while the substrate is in motion.

\* \* \* \* \*